(12) United States Patent
Perepukhov et al.

(10) Patent No.: US 11,686,796 B2
(45) Date of Patent: Jun. 27, 2023

(54) TECHNIQUES FOR DETERMINING A NUCLEAR MAGNETIC RESONANCE RELAXATION TIME AND/OR A NUCLEAR MAGNETIC RESONANCE SPECTRUM OF A PROBE

(71) Applicant: Terra Quantum AG, St. Gallen (CH)

(72) Inventors: Aleksandr Perepukhov, St. Gallen (CH); Gordey Lesovik, St. Gallen (CH); Andrey Lebedev, St. Gallen (CH)

(73) Assignee: Terra Quantum AG, St. Gallen (CH)

( * ) Notice: Subject to any disclaimer, the term of this patent is extended or adjusted under 35 U.S.C. 154(b) by 0 days.

(21) Appl. No.: 17/488,630

(22) Filed: Sep. 29, 2021

(65) Prior Publication Data

US 2022/0099768 A1    Mar. 31, 2022

(30) Foreign Application Priority Data

Sep. 29, 2020  (EP) ..................... 20199026

(51) Int. Cl.
  *G01R 33/46*  (2006.01)
(52) U.S. Cl.
  CPC ..... *G01R 33/4608* (2013.01); *G01R 33/4625* (2013.01)
(58) Field of Classification Search
  CPC ............ G01R 33/282; G01R 33/448; G01R 33/4608; G01R 33/4625; G01R 33/5605
  See application file for complete search history.

(56) References Cited

U.S. PATENT DOCUMENTS

| | | | | | |
|---|---|---|---|---|---|
| 4,706,024 | A | * | 11/1987 | Dumoulin | G01R 33/4833 324/309 |
| 6,133,736 | A | * | 10/2000 | Pervushin | G01R 33/4608 324/309 |
| 2002/0041850 | A1 | * | 4/2002 | Szyperski | G01R 33/4633 424/9.3 |

(Continued)

FOREIGN PATENT DOCUMENTS

| EP | 1845388 A1 | 10/2007 |
|---|---|---|
| GB | 2405941 A | 3/2005 |

OTHER PUBLICATIONS

Kay et al., "The Measurement of Heteronuclear Transverse Relaxation Times in AX3 Spin Systems via Polarization-Transfer Techniques," *Journal of Magnetic Resonance*, 100(3), 538-558 (Dec. 1992).

(Continued)

*Primary Examiner* — Steven L Yeninas
(74) *Attorney, Agent, or Firm* — Leydig, Voit & Mayer, Ltd.

(57) ABSTRACT

A system and method for determining a nuclear magnetic resonance relaxation time of a probe includes polarizing first nuclei and second nuclei by applying a longitudinal static magnetic field to the probe, exchanging the polarizations of the first nuclei and the second nuclei by irradiating a swap sequence of transverse magnetic field pulses, transversely magnetizing the second nuclei by irradiating at least one excitation pulse and measuring the resulting magnetization signal of the second nuclei, and determining the nuclear magnetic resonance relaxation time of the second nuclei based on the measured magnetization signal of the second nuclei.

14 Claims, 3 Drawing Sheets

(56) References Cited

U.S. PATENT DOCUMENTS

| | | | | |
|---|---|---|---|---|
| 2004/0051528 A1* | 3/2004 | Mor | ............... | G01R 33/4608 324/300 |
| 2007/0052416 A1* | 3/2007 | Bottcher | ............ | G01R 33/4608 324/309 |
| 2007/0247152 A1* | 10/2007 | Klomp | ............... | G01R 33/4608 324/318 |
| 2010/0219826 A1* | 9/2010 | Duckett | ................. | A61K 49/06 324/307 |
| 2010/0225314 A1* | 9/2010 | Kuge | ................... | G01R 33/485 324/307 |
| 2011/0001475 A1* | 1/2011 | Vasos | ................... | G01R 33/282 324/307 |

OTHER PUBLICATIONS

Linden et al., "How to Exchange Information Between Two Coupled Nuclear Spins: the Universal SWAP Operation," *Chemical Physics Letters*, 307(3-4), 198-204 (Jul. 1999).

Schulte-Herbrueggen et al., "The Relationship Between Ensemble Quantum Computing Logical Gates and NMR Pulse Sequence Engineering Exemplified by the SWAP Operation," *Concepts in Magnetic Resonance*, 12(6), 389-395 (Jan. 2000).

Watanabe et al., "In Vivo3D Localized 13C Spectroscopy Using Modified INEPT and DEPT," *Journal of Magnetic Resonance*, 134(2), 214-222 (Oct. 1998).

European Patent Office, European Search Report in European Patent Application No. 20199026.4, 9 pp. (dated Mar. 15, 2021).

\* cited by examiner

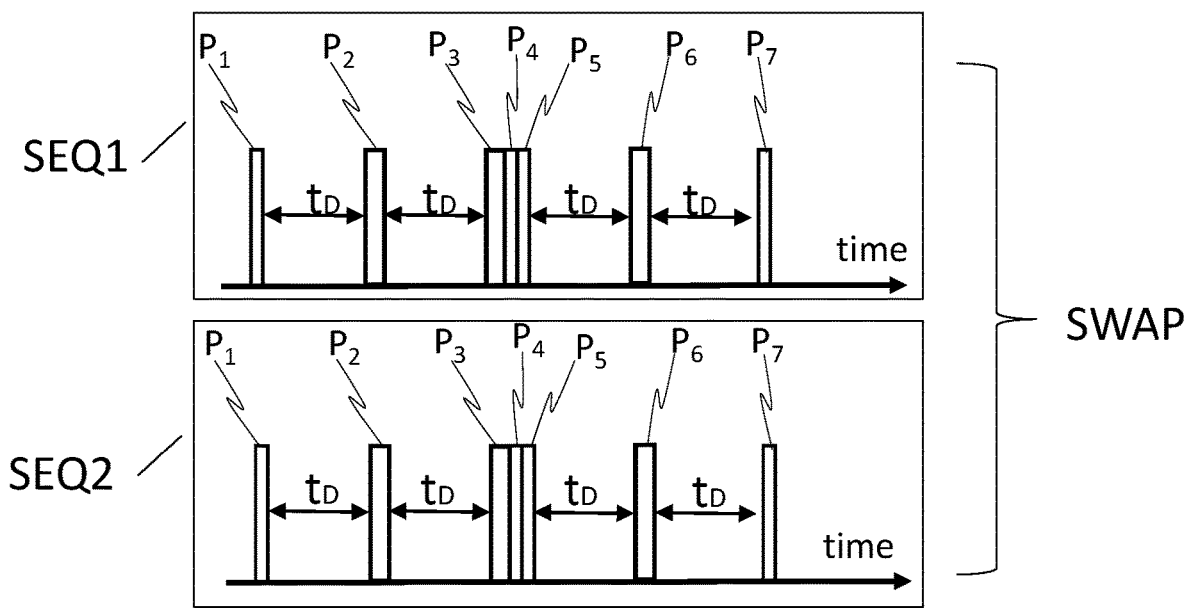
Figure 3
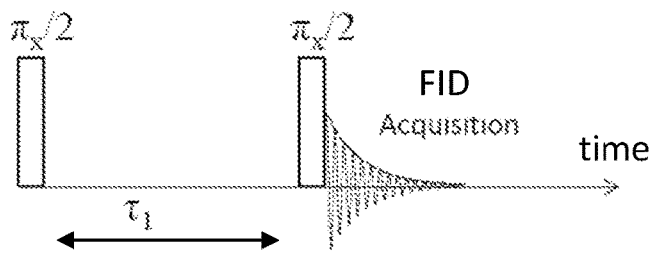
Figure 4a
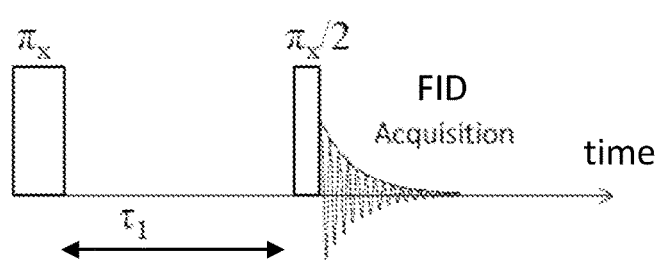
Figure 4b
Figure 4c
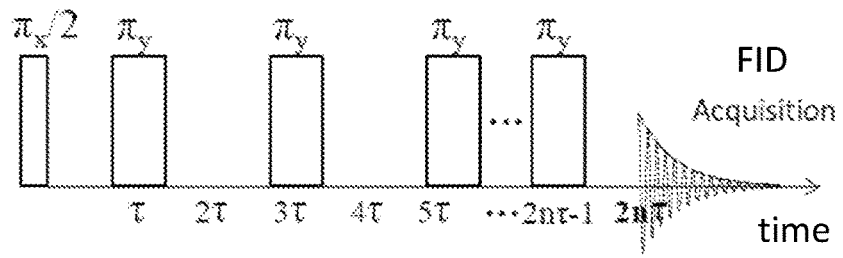

Chemical Shift (ppm)

Chemical Shift (ppm)

TECHNIQUES FOR DETERMINING A NUCLEAR MAGNETIC RESONANCE RELAXATION TIME AND/OR A NUCLEAR MAGNETIC RESONANCE SPECTRUM OF A PROBE

CROSS-REFERENCE TO RELATED APPLICATIONS

This patent application claims the benefit of European Patent Application No. 20199026.4, filed Sep. 29, 2020, which is fully incorporated herein by reference.

TECHNICAL FIELD

The invention relates to a method, apparatus, computer program and data carrier for determining at least one of a nuclear magnetic resonance relaxation time of a probe and a nuclear magnetic resonance spectrum of a probe, wherein the probe comprises first nuclei with a first gyromagnetic ratio and second nuclei with a second gyromagnetic ratio, and the first gyromagnetic ratio is larger than the second gyromagnetic ratio.

BACKGROUND

Nuclear magnetic resonance (NMR) spectroscopy is one of the most fundamental spectroscopic techniques for studying electronic properties of matter in physics, chemistry and biology. Exemplarily, the application do-main of NMR relaxometry may span the study of porous media in the petroleum industry, the structural analysis of solid fats and seed oils or the testing of contrast agents in magnetic resonance imaging (MM). Further applications relate to the study of the physical and chemical properties of polymers, e.g., the determination of their electronic densities, the degree of crystallinity, the degree of polymerization or the proportion of plasticizers and other additives.

In NMR spectroscopy a strong static longitudinal magnetic field is applied to a probe and a magnetic response signal of the probe is measured after exciting the probe using a specific sequence of transverse magnetic field excitation pulses. However, when exciting nuclei of the probe with small gyromagnetic ratios, the strength of the detected magnetic response signal may be rather weak. In such a case it may be necessary to perform multiple excitation and measurement sequences in order to ensure an acceptable signal-to-noise ratio. Typically, between two such sequences one needs to wait until the nuclei of the probe return to their equilibrium state in the applied static longitudinal magnetic field, i.e., before another excitation and measurement step can be carried out. Therefore, in a typical experiment the determination of a nuclear magnetic resonance relaxation time or a nuclear magnetic resonance spectrum can take a very long time on the order of several hours or even several days.

OVERVIEW

An object of the invention is to overcome such limitations and provide a simple and practical method, apparatus, computer program and data carrier for determining a nuclear magnetic resonance relaxation time and/or a nuclear magnetic resonance spectrum with high accuracy in a time-efficient way.

This object of the invention is achieved by the method, apparatus, computer program and data carrier as described in claims 1, 13, and 14. Advantageous developments and embodiments are described in the dependent claims.

The invention relates to a method of determining a nuclear magnetic resonance relaxation time of a probe and/or a nuclear magnetic resonance spectrum of a probe, wherein the probe comprises first nuclei with a first gyromagnetic ratio and second nuclei with a second gyromagnetic ratio. The first gyromagnetic ratio is larger than the second gyromagnetic ratio.

Here and in the following, a nucleus may refer to an atomic nucleus of an isotope.

The method comprises the following steps:

A first step of polarizing the first nuclei and the second nuclei by applying a longitudinal static magnetic field to the probe.

A second step of exchanging the polarizations of the first nuclei and the second nuclei by irradiating at least one swap sequence of transverse magnetic field pulses.

A third step of transversely magnetizing the second nuclei by irradiating at least one excitation pulse and measuring the resulting magnetization signal.

A fourth step of determining the nuclear magnetic resonance relaxation time and/or the nuclear magnetic resonance spectrum based on the measured magnetization signal.

Advantageously, by exchanging the polarizations of the first nuclei and the second nuclei by irradiating at least one swap sequence of transverse magnetic field pulses in the second step, the polarizations of the first nuclei may be transferred to the second nuclei and the polarizations of the second nuclei may be transferred to the first nuclei, i.e., the at least one swap sequence may correspond to a full swap operation of the respective nuclear polarizations.

Consequently, the strength of the magnetization signal of the second nuclei measured in the third step may be considerably increased, because a stronger polarization of the first nuclei in the longitudinal static magnetic field due to its larger gyromagnetic ratio may have been transferred to the second nuclei. More specifically, according to the proposed method the intensity of the magnetization signal may have increased by a factor that corresponds to the ratio of the first gyromagnetic ratio to the second gyromagnetic ratio. Therefore, also the signal to noise ratio may be improved considerably.

Moreover, by irradiating the at least one swap sequence the polarizations of the second nuclei may also be transferred to the first nuclei, leading to a complete exchange of the respective polarizations, thereby enabling a more efficient re-initialization of the probe and simplifying the proposed method considerably as less gradient pulses and a smaller number of parameters for which calibration is needed may be required.

Furthermore, in order to accomplish a full exchange of the polarization of the first nuclei and the second nuclei by irradiating a swap sequence of transverse magnetic field pulses, the underlying quantum-mechanical structure of the two interacting quantum systems, i.e., the first nuclei and the second nuclei, may be accurately taken into account in the design of the at least one swap sequence, thereby improving the accuracy and precision of the proposed method.

Preferably, the atoms corresponding to the first nuclei and the atoms corresponding to the second nuclei are covalently bound to form molecules.

Exemplarily, the first gyromagnetic ratio may be at least four times larger than the second gyromagnetic ratio.

The nuclear spins of the first nuclei and the second nuclei may interact via a longitudinal spin-spin interaction, wherein the spin-spin interaction corresponds to a coupling between the nuclear spin components in the longitudinal direction of the static magnetic field applied in the first step.

Exemplarily, the first nuclei may be atomic nuclei of hydrogen isotopes, e.g., $^1$H isotopes. The second nuclei may be atomic nuclei of $^{15}$N or $^{13}$C isotopes. The probe may comprise a water solution of isotopically enriched protein molecules.

The longitudinal static magnetic field applied to the probe in the first step may be applied to the probe also while carrying out the second step and the third step, such that the first nuclei and the second nuclei constantly remain exposed to the longitudinal static magnetic field at least from the first step to the third step.

The second step may be carried out after the first step is carried out. The third step may be carried out after the second step is carried out. The fourth step may be carried out after the third step is carried out.

The applied static longitudinal magnetic field may induce a Zeeman energy splitting $\Delta E = \hbar \gamma B$ between the ground state and an excited state of a nuclear spin, wherein the Zeeman energy splitting $\Delta E$ may be proportional to the respective gyromagnetic ratio $\gamma$ of the nucleus and the effective magnetic field B at the respective nuclei, and $\hbar = h/2\pi$ where h denotes the Planck constant.

Due to chemical shielding by the electron density surrounding a nucleus, the effective magnetic field B at the respective nuclei may be reduced with respect to the applied static longitudinal magnetic field $B_0$. Thus, the resonance frequency $\omega = \gamma B$, also known as Larmor frequency, may contain information about the electronic structure surrounding a nucleus and is therefore also referred to as chemical shift.

A polarization of a nucleus may correspond to a population difference of the two Zeeman energy levels.

More specifically, a population difference may refer to a difference in the population of the Zeeman energy levels in the presence of the longitudinal static magnetic field at thermal equilibrium, wherein the splitting $\Delta E$ of the Zeeman energy levels is induced by the interaction of the nuclear dipole with the longitudinal static magnetic field.

The population difference may be calculated from the Boltzmann factor $N_2/N_1 = e^{-\hbar \gamma B/kT}$ where $N_1$ is the population of the ground state, $N_2$ is the population of the excited state, k is the Boltzmann constant and T denotes the temperature. At room temperature the Boltzmann factor can be expanded to first order as $N_2/N_1 = e^{-\hbar \gamma B/kT} \approx 1 - \hbar \gamma B/kT$. Consequently, a smaller gyromagnetic ratio $\gamma$ may lead to a smaller population difference and, correspondingly, to a smaller strength of the magnetization signal.

The corresponding Zeeman energy levels form an effective two-level quantum system that can be manipulated, e.g., excited and de-excited, by irradiating transverse magnetic field pulses. The irradiating of the transverse magnetic field pulses may then correspond to rotations of a spin-1/2 corresponding to the two-level quantum system and representing the nuclear spin on a Bloch sphere with a specific magnetic field pulse rotation angle that is determined by the pulse duration.

Preferably, by irradiating the at least one swap sequence of transverse magnetic field pulses in the second step, the nuclear spins or the bulk magnetization of the first nuclei and the nuclear spins or bulk magnetization of the second nuclei may become realigned with the longitudinal static magnetic field immediately after the second step is carried out and before the third step is carried out. The bulk transverse magnetization of the first nuclei and the bulk transverse magnetization of the second nuclei may average to zero immediately after the irradiating of the swap sequence in the second step. Thus, after the second step, the first nuclei and the second nuclei may already be in their equilibrium or cooled state with respect to the applied static longitudinal magnetic field, enabling immediate and fast transverse excitation in the second step and acquisitions of the magnetization signal in the third step.

The irradiating of the at least one swap sequence of transverse magnetic field pulses in the second step may comprise irradiating a first sequence of transverse magnetic field pulses to excite the first nuclei and irradiating a second sequence of transverse magnetic field pulses to excite the second nuclei. The pulse frequencies of the transverse magnetic field pulses of the first sequence may correspond to the Larmor frequency of the first nuclei in the longitudinal static magnetic field. The pulse frequencies of the transverse magnetic field pulses of the second sequence may correspond to the Larmor frequency of the second nuclei in the longitudinal static magnetic field. Therefore, the first sequence may excite the first nuclei and the second sequence may excite the second nuclei. Most preferably, the transverse magnetic field pulses are resonant pulses, i.e., the pulse frequencies of the transverse magnetic field pulses may be identical with the respective Larmor frequencies (on-resonance excitation).

The first sequence of transverse magnetic field pulses and the second sequence of transverse magnetic field pulses may be irradiated simultaneously and/or synchronously. Specifically, the transverse magnetic field pulses of the first sequence and the transverse magnetic field pulses of the second sequence may be irradiated simultaneously and/or synchronously.

The temporal length of the first sequence of transverse magnetic field pulses and the temporal length of the second sequence of transverse magnetic field pulses may be the same.

Exemplarily, the temporal length of the at least one swap sequence, the temporal length of the first sequence and/or the temporal length of the second sequence may be identical to the inverse of the longitudinal spin-spin interaction strength between the first nuclei and the second nuclei (given in frequency units).

Preferably, each transverse magnetic field pulses of the first sequence may correspond to a transverse magnetic field pulse of the second sequence in terms of pulse-center timing, magnetic field pulse rotation angle and/or magnetic field pulse oscillation direction. The magnetic field pulse oscillation direction may be perpendicular to the longitudinal direction of the static magnetic field applied in the first step. The magnetic field pulse rotation angle may correspond to the temporal width of a transverse magnetic field pulse. The temporal width of a transverse magnetic field pulse may be on the order of the inverse Larmor frequency (in appropriate units). The pulse-center timing may correspond to the time when the maximum amplitude peak of a transverse magnetic field pulse exits the pulse generator, e.g., in case of a Gaussian pulse shape. The transverse magnetic field pulse may also be a rectangular pulse.

In the following, it may be assumed for concreteness that the longitudinal static magnetic field is applied in the longitudinal z-direction of a Cartesian coordinate system. However, this is merely for notational convenience, and in general the magnetic field may be applied in any spatial direction. A $(\pi_d/2)$-pulse refers to a transverse magnetic field pulse with a magnetic field pulse rotation angle of $\pi/2$ and a magnetic field pulse oscillation direction corresponding to a transverse direction in the Cartesian coordinate system, wherein the lower index a may denote the transverse x-direction (a=x), the transverse y-direction (a=y), the transverse negative x-direction (a=−x) or the transverse negative y-direction (a=−y). Thus, a $(\pi_a/2)$-pulse corresponds to half a Rabi cycle of the two-level quantum system, wherein the two-level quantum system is defined by the splitting of two Zeeman energy levels of a nuclei of the probe induced by the static longitudinal magnetic field. Correspondingly, a $\pi_a$-pulse corresponds to a full Rabi cycle. For the determination of the respective rotation directions a right hand rule may apply.

Exemplarily, the irradiating of the at least one swap sequence of transverse magnetic field pulses, the irradiating of the first sequence of transverse magnetic field pulses and/or the irradiating of the second sequence of transverse magnetic field pulses in the second step may comprise:

irradiating a first transverse magnetic field pulse, wherein the first transverse magnetic field pulse is a $(\pi_x/2)$-pulse, irradiating a second transverse magnetic field pulse with a predetermined time delay after irradiating the first transverse magnetic field pulse, wherein the second transverse magnetic field pulse is a $\pi_x$-pulse, irradiating a third transverse magnetic field pulse with the predetermined time delay after irradiating the second transverse magnetic field pulse, wherein the third transverse magnetic field pulse is a $\pi_x$-pulse, irradiating a fourth transverse magnetic field pulse with no time delay and immediately after irradiating the third transverse magnetic field pulse, wherein the fourth transverse magnetic field pulse is a $(\pi_{-x}/2)$-pulse, irradiating a fifth transverse magnetic field pulse with no time delay and immediately after irradiating the fourth transverse magnetic field pulse, wherein the fifth transverse magnetic field pulse is a $(\pi_y/2)$-pulse, irradiating a sixth transverse magnetic field pulse with the predetermined time delay after irradiating the fifth transverse magnetic field pulse, wherein the sixth transverse magnetic field pulse is a $\pi_x$-pulse, irradiating a seventh transverse magnetic field pulse with the predetermined time delay after irradiating the sixth transverse magnetic field pulse, wherein the seventh transverse magnetic field pulse is a $(\pi_{-y}/2)$-pulse.

The at least one swap sequence of transverse magnetic field pulses, the first sequence of transverse magnetic field pulses and/or the second sequence of transverse magnetic field pulses may also be simplified further in the following way:

Optionally, the third transverse magnetic field pulse and the fourth transverse magnetic field pulse may be combined to and/or replaced by a combined transverse magnetic field pulse following with a predetermined time delay $t_D$ after the second transverse magnetic field pulse, wherein the combined transverse magnetic field pulse is a $(\pi_x/2)$-pulse.

Preferably, the predetermined time delay is given by $t_D=1/(4J_{HN})$ and thus corresponds to one quarter of the inverse of the longitudinal spin-spin interaction strength $J_{HN}$ between the first nuclei and the second nuclei (in frequency units). It is noted that the temporal width of a transverse magnetic field pulse is on the order of the inverse Larmor frequency and thus much smaller than the predetermined time delay, because the Larmor frequency is much larger than the longitudinal spin-spin interaction strength $J_{HN}$. The temporal width of the transverse magnetic field pulses can thus be neglected when determining the temporal length of the at least one swap sequence of transverse magnetic field pulses, the temporal length of the first sequence of transverse magnetic field pulses and/or the temporal length of the second sequence of transverse magnetic field pulses.

Most preferably, the swap sequence in the second step comprises irradiating synchronously a first sequence of transverse magnetic field pulses and a second sequence of transverse magnetic field pulses. The first sequence may comprise irradiating the sequence of pulses from the first transverse magnetic field pulse to the seventh transverse magnetic field pulse as described above, wherein the respective pulse frequencies may correspond to the Larmor frequency of the first nuclei, and/or the respective magnetic field pulse rotation angles may correspond to half or full Rabi cycles of the first nuclei. The second sequence may comprise irradiating the sequence of pulses from the first transverse magnetic field pulse to the seventh transverse magnetic field pulse as described above, wherein the respective pulse frequencies may correspond to the Larmor frequency of the second nuclei, and/or the respective magnetic field pulse rotation angles may correspond to half or full Rabi cycles of the second nuclei.

Optionally, at least the second step and the third step may form a scan sequence that is repeatedly carried out, i.e., iteratively repeated in an iteration loop, in order to achieve an improved signal-to-noise ratio in the determination of the nuclear magnetic relaxation time and/or the nuclear magnetic spectrum in the fourth step. The iteration loop may terminate when a predetermined signal-to-noise ratio is achieved.

The time delay between carrying out two scan sequences may be identical to a thermal equilibration time $T_{eq}$ of the first nuclei, i.e., the time required to at least approximately equilibrate the first nuclei in the static longitudinal magnetic field.

Preferably, the time delay between carrying out two scan sequences is larger or equal to five times the longitudinal relaxation time of the first nuclei.

Most preferably, the time delay between carrying out two scan sequences is smaller than five times the longitudinal relaxation time of the second nuclei.

Optionally, the longitudinal relaxation time of the first nuclei may be predetermined, estimated and/or measured in advance.

Thus, compared to the case where the time delay corresponds to an equilibration time of the second nuclei, a more rapid re-initialization after measuring the magnetization signal of the second nuclei in the third step can be achieved, and a second scan sequence can be carried out without further delay. In particular, after the nuclear spin of the first nuclei has quickly equilibrated in the static longitudinal magnetic field, its polarization is fully restored and may be exchanged with the second nuclei or other nuclei regardless of their state at that moment. Therefore, the proposed method may allow achieving a predetermined signal to noise ratio with a smaller number of iterations and in a smaller amount of time.

The probe may also comprise a third nuclei with a third gyromagnetic ratio. The nuclear spin of the third nuclei may interact with the nuclear spin of the first nuclei and/or with the nuclear spin of the second nuclei via longitudinal spin-spin interactions. The third nuclei may be atomic nuclei of $^{15}N$ or $^{13}C$ isotopes.

Optionally, the exchanging of the polarizations of the first nuclei and the second nuclei by irradiating at least one swap sequence of transverse magnetic field pulses in the second step may comprise:

exchanging of the polarization of the first nuclei and the third nuclei by irradiating a first swap sequence of transverse magnetic field pulses, and exchanging of the polarization of the third nuclei and the second nuclei by irradiating a second swap sequence of transverse magnetic field pulses, and exchanging of the polarization of the first nuclei and the third nuclei by irradiating a third swap sequence of transverse magnetic field pulses.

The first swap sequence, the second swap sequence and the third swap sequence may be irradiated consecutively, one after the other. The second swap sequence may be irradiated with no time delay immediately after the first swap sequence. The third swap sequence may be irradiated with no time delay immediately after the second swap sequence.

The first swap sequence may comprise irradiating synchronously a first sequence of transverse magnetic field pulses and a second sequence of transverse magnetic field pulses. The first sequence of the first swap sequence may comprise the sequence of pulses from the first transverse magnetic field pulse to the seventh transverse magnetic field pulse as described further above, wherein the respective pulse frequencies may correspond to the Larmor frequency of the first nuclei, and/or the respective magnetic field pulse rotation angles may correspond to half or full Rabi cycles of the first nuclei. The second sequence of the first swap sequence may comprise irradiating the sequence of pulses from the first transverse magnetic field pulse to the seventh transverse magnetic field pulse as described further above, wherein the respective pulse frequencies may correspond to the Larmor frequency of the third nuclei and/or the respective magnetic field pulse rotation angles may correspond to half or full Rabi cycles of the third nuclei.

The predetermined time delay of the first swap sequence may then be given by $t_D=1/(4\,J_{HC})$ and may thus corresponds to one quarter of the inverse of the longitudinal spin-spin interaction strength $J_{HC}$ between the first nuclei and the third nuclei (in frequency units).

The second swap sequence may comprise irradiating synchronously a first sequence of transverse magnetic field pulses and a second sequence of transverse magnetic field pulses. The first sequence of the second swap sequence may comprise the sequence of pulses from the first transverse magnetic field pulse to the seventh transverse magnetic field pulse as described further above, wherein the respective pulse frequencies may correspond to the Larmor frequency of the second nuclei and/or the respective magnetic field pulse rotation angles may correspond to half or full Rabi cycles of the second nuclei. The second sequence of the second swap sequence may comprise irradiating the sequence of pulses from the first transverse magnetic field pulse to the seventh transverse magnetic field pulse as described further above, wherein the respective pulse frequencies may correspond to the Larmor frequency of the third nuclei and/or the respective magnetic field pulse rotation angles may correspond to half or full Rabi cycles of the third nuclei.

The predetermined time delay of the second swap sequence may be given by $t_D=1/(4\,J_{CN})$ and may thus correspond to one quarter of the inverse of the longitudinal spin-spin interaction strength $J_{CN}$ between the second nuclei and the third nuclei (in frequency units).

The third swap sequence may be the same as the first swap sequence.

In this way, a full exchange of the polarizations between the first nuclei and the second nuclei may be achieved indirectly via the third nuclei without the need to irradiate a swap sequence with a predetermined time delay $t_D=1/(4J_{HN})$ between transverse magnetic field pulses.

In particular, the longitudinal spin-spin interaction strength $J_{HN}$ between the first nuclei and the second nuclei may be smaller than the longitudinal spin-spin interaction strength $J_{HC}$ between the first nuclei and the third nuclei and/or smaller than the longitudinal spin-spin interaction strength $J_{CN}$ between the second nuclei and the third nuclei. In that case, exchanging the polarizations between the first nuclei and the second nuclei via the third nuclei be even more beneficial and time-efficient than directly exchanging the polarizations between the first nuclei and the second nuclei by irradiating only a single swap sequence as described further above.

The at least one excitation pulse in the third step may be a $(\pi_y/2)$-pulse or a $(\pi_x/2)$-pulse. The at least one excitation pulse may also comprise two excitation pulses separated by a time delay, wherein the two excitation pulses may form an excitation pulse sequence. An excitation pulse sequence in the third step may correspond to a saturation-recovery pulse sequence or an inverse-recovery pulse sequence. From the resulting magnetization signal(s) of the probe a longitudinal relaxation time of the second nuclei may be determined in the fourth step.

Alternatively, an excitation pulse sequence in the third step may also correspond to aCarr-Purcell-Meiboom-Gil (CPMG) pulse sequence. From the resulting magnetization signal(s) of the probe a transverse relaxation time of the second nuclei may be determined.

When iterating multiple scan sequences the time delay of the corresponding excitation pulse sequences may also be varied from scan sequence to scan sequence in order to measure magnetization signals corresponding to different time delays of the excitation pulse sequence. The nuclear magnetic relaxation time may then be determined from the temporal decay of the magnetization signal as a function of the time delay of an excitation pulse sequence.

Additionally or alternatively, when iterating multiple scan sequences, the pulse phases of the excitation pulses or excitation pulse sequences may also be varied, e.g., alternate, from scan sequence to scan sequence. For example, the magnetic field pulse oscillation direction may alternate between the x-direction and the y-direction.

Exemplarily, in a first scan sequence the magnetic field pulse oscillation direction of the excitation pulse or excitation pulse sequence in the third step may be the x-direction, and the magnetization signal measured in the third step of the first sequence may correspond to the transverse magnetization in the x-direction. In a second scan sequence the magnetic field pulse oscillation direction of the excitation pulse or excitation pulse sequence in the third step may be the y-direction, and the magnetization signal measured in the third step of the first sequence may correspond to the transverse magnetization in the y-direction. By implementing such phase cycles, i.e., changing pulse phases from scan sequence to scan sequence, errors due to inaccuracies in the pulse width settings may be eliminated. In particular, since the bulk magnetization of the first nuclei and the second nuclei after carrying out the second step may exclusively be directed in the longitudinal direction of the static longitudinal magnetic field, such phase cycles can be realized in a particular simple and efficient manner.

The nuclear magnetic resonance relaxation time determined in the fourth step may be a longitudinal relaxation time of the second nuclei or a transverse relaxation time of the second nuclei.

The nuclear magnetic resonance spectrum determined in the fourth step may be a one-dimensional or a two-dimensional nuclear magnetic resonance spectrum of the second nuclei, which may be obtained by a Fourier transformation of the magnetization signal(s) measured in the third step.

The nuclear magnetic resonance relaxation time may be determined from a damping of the free induction decay(s) corresponding to the magnetization signal(s) and/or from the width of one or several resonances in a nuclear magnetic resonance spectrum.

In another aspect, the invention relates to an apparatus configured to determine a nuclear magnetic resonance relaxation time of a probe (P) and/or a nuclear magnetic resonance spectrum of a probe (P), wherein the probe (P) comprises first nuclei (H) with a first gyromagnetic ratio and second nuclei (N) with a second gyromagnetic ratio, and the first gyromagnetic ratio is larger than the second gyromagnetic ratio.

The apparatus comprises at least one static magnetic field generating unit configured to polarize the first nuclei and the second nuclei by applying a longitudinal static magnetic field to the probe. The apparatus further comprises at least one electromagnetic pulse generating unit configured to exchange the polarizations of the first nuclei and the second nuclei by irradiating at least one swap sequence of transverse magnetic field pulses. The at least one electromagnetic pulse generating unit is also configured to transversely magnetize the second nuclei by irradiating at least one excitation pulse of transverse magnetic field pulses. The apparatus further comprises at least one signal receiving unit configured to measure magnetization signal(s) resulting from the at least one excitation pulse. The apparatus further comprises at least one electronic control and evaluation unit configured to determine the nuclear magnetic resonance relaxation time and/or the nuclear magnetic resonance spectrum based on the measured magnetization signal(s).

In particular, the invention may relate to an apparatus configured to carry out the method with some or all of the steps described above.

The invention also relates to a computer program comprising computer-readable instructions which, when the program is executed by a computer, cause the computer to carry out the method with some or all of the steps described above.

The computer program (or a sequence of instructions) may use software means for performing the method of determining a nuclear magnetic resonance relaxation time of a probe and/or a nuclear magnetic resonance spectrum of a probe when the computer program runs in a computing unit. The computer program can be stored directly in an internal memory, a memory unit or the data storage unit of the at least one electronic control and evaluation unit.

The invention also relates to a computer-readable data carrier having stored thereon the computer program described above. The computer program product can be stored in machine-readable data carriers, preferably digital storage media.

In summary, a simple and practical method, apparatus, computer program and data carrier for determining a nuclear magnetic resonance relaxation time of a probe and/or a nuclear magnetic resonance spectrum of a probe with high accuracy and time efficiency is proposed. The proposed method allows irradiating only a small amount of pulses within a comparably short time period and takes into account the quantum mechanical nature of the first, second and/or third nuclei. Moreover, the proposed method may allow a smaller number of experimental parameters for which calibration is needed as compared to state of the art protocols.

BRIEF DESCRIPTION OF THE DRAWINGS

Exemplary embodiments of the invention are illustrated in the drawings and will be described with reference to FIGS. 1 to 5.

In the figures:

FIG. 3 shows an embodiment of a swap pulse sequence,

FIG. 4a shows a saturation-recovery pulse sequence as an embodiment of an excitation pulse sequence, FIG. 4b shows an inverse-recovery pulse sequence as an embodiment of an excitation pulse sequence, FIG. 4c shows a CPMG pulse sequence as an embodiment of an excitation pulse sequence.

DETAILED DESCRIPTION OF EMBODIMENTS

Figure 1:
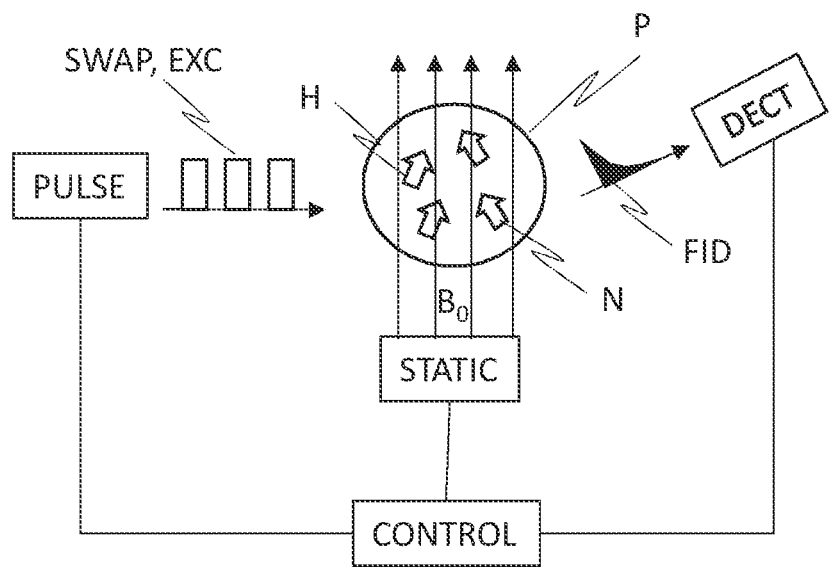
FIG. 1 shows a schematic diagram of an embodiment of the apparatus.

FIG. 1 shows a schematic diagram of an embodiment of the apparatus. The apparatus comprises one static magnetic field generating unit STATIC configured to polarize the first nuclei H and the second nuclei N by applying a longitudinal static magnetic field $B_0$ to the probe P.

The apparatus further comprises one electromagnetic pulse generating unit PULSE configured to exchange the polarizations of the first nuclei H and the second nuclei N by irradiating a swap sequence SWAP of transverse magnetic field pulses. The electromagnetic pulse generating unit PULSE is also configured to transversely magnetize the second nuclei N by irradiating an excitation pulse sequence EXC of transverse magnetic field pulses.

The apparatus further comprises one signal receiving unit DECT configured to measure a magnetization signal FID of the second nuclei N resulting from irradiating the excitation pulse sequence EXC.

The apparatus further comprises one electronic control and evaluation unit CONTROL configured to determine a nuclear magnetic resonance relaxation time and a nuclear magnetic resonance spectrum based on the measured magnetization signal FID of the second nuclei N.

The static magnetic field generating unit STATIC, the electromagnetic pulse generating unit PULSE and the signal receiving unit DECT are electronically connected to the electronic control and evaluation unit CONTROL. The static magnetic field generating unit STATIC is configured to generate a magnetic field with a strength between 5 Tesla and 20 Tesla. The electromagnetic pulse generating unit PULSE comprises magnetic excitation coils and is configured to generate radio-frequency pulses as transverse magnetic field pulses. The signal receiving unit DECT comprises magnetic receiver coils. The magnetic receiver coils of the signal receiving unit DECT are the same as the magnetic excitation coils of the electromagnetic pulse generating unit PULSE. The signal receiving unit DECT also comprises at least one amplifier configured to amplify the magnetization signal FID. The electronic control and evaluation unit CONTROL comprises a computer.

Recurring features are provided in the following figures with identical reference signs as in FIG. 1.

Figure 2:
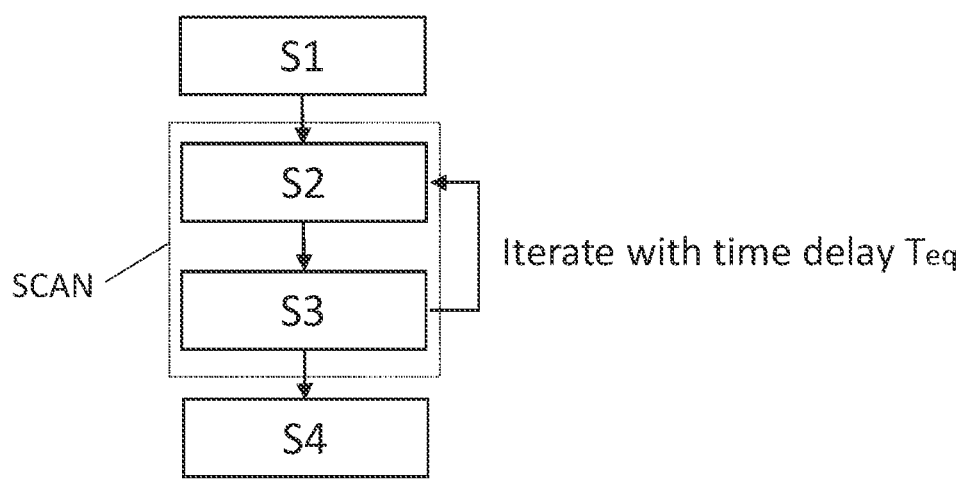
FIG. 2 shows a schematic flow diagram of an embodiment of the method.

FIG. 2 shows a schematic flow diagram of an embodiment of the method of determining a nuclear magnetic resonance relaxation time of a probe P and a nuclear magnetic resonance spectrum of a probe P, wherein the probe P comprises first nuclei H with a first gyromagnetic ratio and second nuclei N with a second gyromagnetic ratio. The first gyromagnetic ratio is larger than the second gyromagnetic ratio.

The method comprises a first step S1 of polarizing the first nuclei H and the second nuclei N by applying a longitudinal static magnetic field $B_0$ to the probe P, a second step S2 of exchanging the polarizations of the first nuclei H and the second nuclei N by irradiating a swap sequence SWAP of transverse magnetic field pulses, a third step S3 of transversely magnetizing the second nuclei N by irradiating an excitation pulse sequence EXC and measuring the resulting magnetization signal FID of the second nuclei N, and a fourth step S4 of determining the nuclear magnetic resonance relaxation time $T_1(N)$ of the second nuclei N and the nuclear magnetic resonance spectrum of the second nuclei N based on the measured magnetization signal FID of the second nuclei N.

The magnetization signal FID corresponds to the time-decaying transverse bulk magnetization of the second nuclei and is also called free induction decay. The magnetization signal FID induces a time-dependent electrical current that is measured in a magnetic receiver coil of the signal receiving unit DECT.

The second step S2 and the third step S3 form a scan sequence SCAN that is iteratively repeated for an improved signal-to-noise ratio when determining the nuclear magnetic relaxation time $T_1(N)$ of the second nuclei N and the nuclear magnetic spectrum of the second nuclei N in the fourth step S4.

The time delay between two scan sequences SCAN, i.e., the time gap between irradiating the last transverse magnetic field pulse of the excitation pulse sequence EXC in the third step S3 of a first scan sequence and irradiating the first transverse magnetic field pulse of a swap sequence SWAP in the second step S2 of a second scan sequence that follows directly after the first scan sequence, corresponds to a thermal equilibration time Teq of the first nuclei H.

FIG. 3 shows an embodiment of a swap pulse sequence SWAP. The swap sequence SWAP of transverse magnetic field pulses comprises a first sequence SEQ1 of transverse magnetic field pulses to excite the first nuclei H and a second sequence SEQ2 of transverse magnetic field pulses to excite the second nuclei N. Thereby, the pulse frequencies of the transverse magnetic field pulses of the first sequence SEQ1 correspond to the Larmor frequency of the first nuclei H in the longitudinal static magnetic field $B_0$. The pulse frequencies of the transverse magnetic field pulses of the second sequence SEQ2 correspond to the Larmor frequency of the second nuclei N in the longitudinal static magnetic field $B_0$. The first sequence SEQ1 of transverse magnetic field pulses and the second sequence SEQ2 of transverse magnetic field pulses are irradiated simultaneously and synchronously.

In the following, it is assumed that the longitudinal static magnetic field $B_0$ is applied in the longitudinal z-direction of a Cartesian coordinate system, for ease of reference.

Then, each of the first sequence SEQ1 and the second sequence SEQ2 may comprise the following transverse magnetic field pulses:

a first transverse magnetic field pulse P1, wherein the first transverse magnetic field pulse P1 is a $(\pi_x/2)$-pulse, a second transverse magnetic field pulse P2 with a predetermined time delay $t_D$ with respect to the first transverse magnetic field pulse P1, wherein the second transverse magnetic field pulse P2 is a $\pi_x$-pulse, a third transverse magnetic field pulse P3 with a predetermined time delay $t_D$ with respect to the second transverse magnetic field pulse P2, wherein the third transverse magnetic field pulse P3 is a $\pi_x$-pulse, a fourth transverse magnetic field pulse P4 following with no time delay immediately after the third transverse magnetic field pulse P3, wherein the fourth transverse magnetic field pulse P4 is a $(\pi_{-x}/2)$-pulse, a fifth transverse magnetic field pulse P5 following with no time delay immediately after the fourth transverse magnetic field pulse P4, wherein the fifth transverse magnetic field pulse P5 is a $(\pi_y/2)$-pulse, a sixth transverse magnetic field pulse P6 following with the predetermined time delay $t_D$ after the fifth transverse magnetic field pulse P5, wherein the sixth transverse magnetic field pulse P6 is a $\pi_x$-pulse, and a seventh transverse magnetic field pulse P7 following with the predetermined time delay $t_D$ after the sixth transverse magnetic field pulse P6, wherein the seventh transverse magnetic field pulse P7 is a $(\pi_{-y}/2)$-pulse.

Thus, each transverse magnetic field pulse of the first sequence SEQ1 corresponds to a transverse magnetic field pulse of the second sequence SEQ2 in terms of pulse-center timing, magnetic field pulse rotation angle and magnetic field pulse oscillation direction.

The predetermined time delay is given by $t_D=1/(4J_{HN})$ and thus corresponds to one quarter of the inverse of the longitudinal spin-spin interaction strength $J_{HN}$ between the first nuclei H and the second nuclei N (in frequency units).

In the following, a product operator formalism is used to describe the effect of each pulse of the swap pulse sequence SWAP on the density matrix of the combined system comprising the first nuclei H and the second nuclei N.

The Hamiltonian describing the Larmor frequency contributions and the longitudinal coupling of the nuclear spins of the first nuclei H and the second nuclei N is given (in frequency units) by $$H = -\omega_H I_z - \omega_N S_z + 2\pi J I_z \cdot S_z, \tag{1}$$

where $\omega_H = \gamma_1 B_0$ denotes the Larmor frequency of the first nuclei with the first gyromagnetic ratio $\gamma_1$, $\omega_N = \gamma_2 B_0$ denotes the Larmor frequency of the second nuclei with the second gyromagnetic ratio $\gamma_2$ and J denotes the longitudinal spin-spin interaction that is identical to $J_{HN}$. Moreover, $I_z$ denotes the z-component of the nuclear spin operator of the first nuclei H and $S_z$ denotes the z-component of the nuclear spin operator of the second nuclei N. The quantum-mechanical expectation values of the z-components of the nuclear spin operators then correspond to the respective polarizations.

Initially, i.e., before the swap pulse sequence SWAP is irradiated, the state of the combined system can at least approximately be described by the density matrix $$\rho_0 = \gamma_H I_z + \gamma_X S_z, \tag{2}$$

where $\gamma_H = \hbar\gamma_1 B_0/kT$ is a constant proportional to the first gyromagnetic ratio $\gamma_1$ and $\gamma_X = \hbar\gamma_2 B_0/kT$ is a constant proportional to the second gyromagnetic ratio $\gamma_2$. The expression above assumes thermal equilibrium at room temperature. Also, a constant additive contribution to the density matrix that is simply proportional to the identity matrix has been omitted in the above expression for simplicity.

By irradiating the first transverse magnetic field pulses P1 of the first sequence SEQ1 and the second sequence SEQ2, the state of the combined system as described by the density matrix is transformed to $$\rho_1 = -\gamma_H I_y - \gamma_X S_y. \quad (3)$$

After waiting for the predetermined time delay $t_D$, the state of the combined system is transformed by the unitary Hamiltonian dynamics to $$\rho_2 = -\gamma_H I_y \cos\varphi + \gamma_H 2 I_x S_z \sin\varphi - \gamma_X S_y \cos\varphi + \gamma_X 2 I_z S_x \sin\varphi, \quad (4)$$

$$\varphi = \pi J * \left(\frac{1}{4J}\right).$$

By irradiating the second transverse magnetic field pulses P2 of the first sequence SEQ1 and the second sequence SEQ2, the state of the combined system as described by the density matrix is transformed to $$\rho_3 = \gamma_H I_y \cos\varphi - \gamma_H 2 I_x S_z \sin\varphi + \gamma_X S_y \cos\varphi - \gamma_X 2 I_z S_x \sin\varphi. \quad (5)$$

After waiting for a predetermined time delay $t_D$, the state of the combined system is transformed by the unitary Hamiltonian dynamics to $$\rho_4 = \gamma_H I_y \cos 2\varphi - \gamma_H 2 I_x S_z \sin 2\varphi + \gamma_X S_y \cos 2\varphi - \gamma_X 2 I_z S_x \sin 2\varphi = -\gamma_H 2 I_x S_z - \gamma_X 2 I_z S_x. \quad (6)$$

By irradiating the third transverse magnetic field pulses P3 of the first sequence SEQ1 and the second sequence SEQ2, the state of the combined system as described by the density matrix is transformed to $$\rho_5 = \gamma_H 2 I_x S_z + \gamma_X 2 I_z S_x. \quad (7)$$

By irradiating the fourth transverse magnetic field pulses P4 of the first sequence SEQ1 and the second sequence SEQ2, the state of the combined system as described by the density matrix is transformed to $$\rho_6 = \gamma_H 2 I_x S_y + \gamma_X 2 I_y S_x. \quad (8)$$

By irradiating the fifth transverse magnetic field pulses P5 of the first sequence SEQ1 and the second sequence SEQ2, the state of the combined system as described by the density matrix is transformed to $$\rho_7 = \gamma_H 2 I_z S_y - \gamma_X 2 I_y S_z. \quad (9)$$

After waiting for the predetermined time delay $t_D$, the state of the combined system is transformed by the unitary Hamiltonian dynamics to $$\rho_8 = -\gamma_H 2 I_z S_y \cos\varphi + \gamma_H S_x \sin\varphi - \gamma_X 2 I_y S_z \cos\varphi + \gamma_X I_z \sin\varphi, \quad (10)$$

$$\varphi = \pi J * \left(\frac{1}{4J}\right).$$

By irradiating the sixth transverse magnetic field pulses P6 of the first sequence SEQ1 and the second sequence SEQ2, the state of the combined system as described by the density matrix is transformed to $$\rho_9 = -\gamma_H 2 I_z S_y \cos\varphi + \gamma_H S_x \sin\varphi - \gamma_X 2 I_y S_z \cos\varphi + \gamma_X I_x \sin\varphi. \quad (11)$$

After waiting for the predetermined time delay $t_D$, the state of the combined system is transformed by the unitary Hamiltonian dynamics to $$\rho_{10} = \gamma_H 2 I_z S_y \cos 2\varphi + \gamma_H S_x \sin 2\varphi - \gamma_X 2 I_y S_z \cos 2\varphi + \gamma_X I_x \sin 2\varphi = \gamma_H S_x + \gamma_X I_x. \quad (12)$$

By irradiating the seventh transverse magnetic field pulses P7 of the first sequence SEQ1 and the second sequence SEQ2, the state of the combined system as described by the density matrix is transformed to $$\rho_{11} = Y_H S_z + \gamma_X I_z. \quad (13)$$

By comparing the state $\rho_0$ of the combined system and the state $\rho_{11}$ of the combined system obtained after irradiating the swap sequence SWAP, it can be seen that a full exchange of the polarizations has been achieved. Moreover, the nuclear spins of the first nuclei H and the nuclear spins of the second nuclei N are realigned with the longitudinal static magnetic field $B_0$ immediately after the irradiating of the seventh transverse magnetic field pulse P7.

FIG. 4a shows a saturation-recovery pulse sequence as an exemplary embodiment of an excitation pulse sequence EXC that is irradiated in the third step S3 in order to be able to measure the magnetization signal FID of the second nuclei N resulting from the excitation pulse sequence EXC. The saturation-recovery pulse sequence comprises two transverse magnetic field pulses, wherein the first transverse magnetic field pulse of the saturation-recovery pulse sequence is a $(\pi_x/2)$-pulse with a pulse frequency corresponding to the Larmor frequency of the second nuclei N and the second transverse magnetic field pulse of the saturation-recovery pulse sequence is also a $(\pi_x/2)$-pulse with a pulse frequency corresponding to the Larmor frequency of the second nuclei N. The second transverse magnetic field pulse of the saturation-recovery pulse sequence is irradiated with a time delay $\tau_1$ after irradiating the first transverse magnetic field pulse of the saturation-recovery pulse sequence. The saturation-recovery pulse sequence is irradiated multiple times, each time with a different time delay $\tau_1$. The longitudinal relaxation time $T_1(N)$ of the second nuclei is then determined from the temporal decay of the magnetization signal FID as a function of the time delay $\tau_1$.

FIG. 4b shows an inverse-recovery pulse sequence as another exemplary embodiment of an excitation pulse sequence EXC that is irradiated in the third step S3. As compared to the saturation-recovery pulse sequence shown in FIG. 4a, the first transverse magnetic field pulse of the inverse recovery pulse sequence is a $\pi_x$-pulse. Otherwise the determination of the longitudinal relaxation time $T_1(N)$ proceeds as described with respect to FIG. 4a.

FIG. 4c shows a CPMG pulse sequence as another exemplary embodiment of an excitation pulse sequence EXC that is irradiated in the third step S3. The first transverse magnetic field pulse of the CPMG pulse sequence is a $(\pi_x/2)$-pulse followed by a series of $\pi_y$-pulses irradiated with specific time delays $\tau$, $2\tau$, . . . as shown in FIG. 4c. The transverse relaxation time $T_2(N)$ of the second nuclei N is determined in the fourth step S4 in a standard way based on the magnetization signal FID measured after irradiating multiple CPMG pulse sequences, each with different characteristic time delays $\tau$.

FIG. 5 shows the molecular structure of ethylphthalimidomalonate-2-$^{13}$C-$^{15}$N molecules. Benzene-d6 is used as a solvent. The probe P thus comprises first nuclei H corresponding to the isotopes $^1$H, second nuclei N corresponding to the isotopes $^{15}$N and third nuclei corresponding to the isotopes $^{13}$C. The longitudinal spin-spin interaction strength direction between the first nuclei H and the second nuclei N is $J_{HN}$=1.7 Hz. The longitudinal spin-spin interaction strength between the first nuclei H and the third nuclei C is $J_{HC}$=139 Hz. The longitudinal spin-spin interaction strength between the second nuclei N and the third nuclei C is $J_{CN}$=13 Hz.

Since the longitudinal spin-spin interaction strength $J_{HN}$ between the first nuclei H and the second nuclei N is smaller than the longitudinal spin-spin interaction strength $J_{HC}$ between the first nuclei H and the third nuclei C and smaller than the longitudinal spin-spin interaction strength $J_{CN}$ between the second nuclei N and the third nuclei C, it is advantageous to exchange the polarizations between the first nuclei H and the second nuclei N indirectly via the third nuclei C as described further below.

This is achieved in an alternative embodiment by irradiating three swap pulse sequences SWAP consecutively, i.e., a first swap pulse sequence SWAP, a second swap pulse sequence SWAP and a third swap pulse sequence SWAP, wherein each of the three swap pulse sequences SWAP comprises transverse magnetic field pulses according to FIG. 3.

More specifically, in an alternative embodiment the exchanging of the polarizations of the first nuclei H and the second nuclei N by irradiating at least one swap sequence SWAP of transverse magnetic field pulses in the second step S2 comprises
  exchanging of the polarizations of the first nuclei H and the third nuclei C by irradiating a first swap sequence SWAP of transverse magnetic field pulses,
  exchanging of the polarizations of the third nuclei C and the second nuclei N by irradiating a second swap sequence SWAP of transverse magnetic field pulses,
  exchanging of the polarizations of the first nuclei H and the third nuclei C by irradiating a third swap sequence SWAP of transverse magnetic field pulses.

The first swap sequence SWAP, the second swap sequence SWAP and the third swap sequence SWAP are irradiated consecutively, one after the other. Thereby, each of the first swap sequence SWAP, the second swap sequence SWAP and the third swap sequence SWAP comprises irradiating synchronously a first sequence SEQ1 of transverse magnetic field pulses and a second sequence SEQ2 of transverse magnetic field pulses as shown in FIG. 3.

The frequencies of the transverse magnetic field pulses of the first sequence SEQ1 of the first swap sequence SWAP correspond to the Larmor frequency of the first nuclei H. The frequencies of the transverse magnetic field pulses of the second sequence SEQ2 of the first swap sequence SWAP correspond to the Larmor frequency of the third nuclei C.

The frequencies of the transverse magnetic field pulses of the first sequence SEQ1 of the second swap sequence SWAP correspond to the Larmor frequency of the second nuclei N. The frequencies of the transverse magnetic field pulses of the second sequence SEQ2 of the second swap sequence SWAP correspond to the Larmor frequency of the third nuclei C.

The frequencies of the transverse magnetic field pulses of the first sequence SEQ1 of the third swap sequence SWAP correspond to the Larmor frequency of the first nuclei H. The frequencies of the transverse magnetic field pulses of the second sequence SEQ2 of the third swap sequence SWAP correspond to the Larmor frequency of the third nuclei C.

The predetermined time delay $t_{D1}$ of the first swap sequence SWAP is then be given by $t_{D1}=1/(4\,J_{HC})$. The predetermined time delay $t_{D2}$ of the second swap sequence SWAP is then be given by $t_{D2}=1/(4\,J_{CN})$. The predetermined time delay $t_{D3}$ of the third swap sequence SWAP is $t_{D3}=t_{D1}$.

As a result the polarizations of the first nuclei H and the polarizations of the second nuclei N are exchanged much faster via the third nuclei C as compared to the direct exchange case using a single swap sequence SWAP discussed with respect to FIG. 3.

Figure 5A:
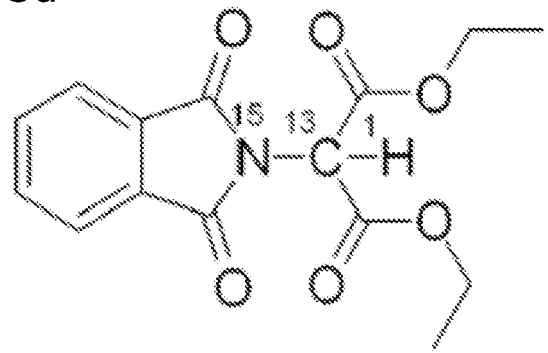
FIG. 5a shows the molecular structure of ethylphthalimidomalonate-2-$^{13}C$-$^{15}N$.
Figure 5B:
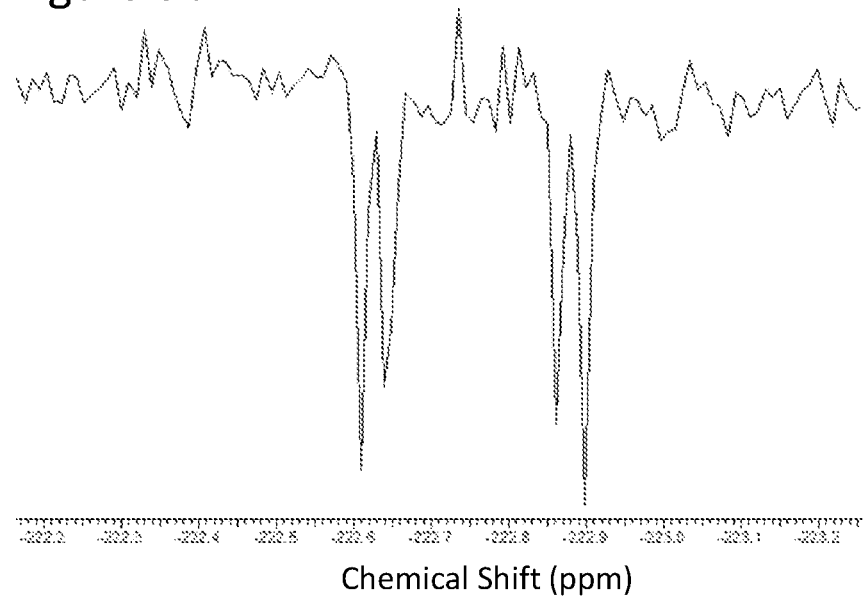
FIG. 5b shows a nuclear magnetic resonance spectrum determined based on a magnetization signal without prior exchange of the polarizations.

FIG. 5b shows a nuclear magnetic resonance spectrum determined in the fourth step S4 based on a magnetization signal FID obtained in the third step S3 without prior exchange of the polarizations using a swap sequence SWAP as proposed in the second step S2, i.e., without carrying out the second step S2 of the proposed method before carrying out the third step S3. More specifically, the nuclear magnetic resonance spectrum shown in FIG. 5b is determined after carrying out 32 iterations of the third step S3 using an inverse-recovery pulse sequence with a time delay $\tau_1$=1 s as an excitation pulse sequence EXC and by averaging over the magnetization signals FID measured in each third step S3. Thereby, the time delay/equilibration time between two third steps S3 in the iteration loop is $T_{eq}$=1000 s. The corresponding experiment lasted a total of about 9 hours. Finally, four results for the longitudinal relaxation times $T_1(N)$=(115±5)s, (119±6)s, (114±7)s, (124±3)s are determined in the fourth step S4 from the widths of the four Lorentzian shaped resonances of the nuclear magnetic resonance spectrum shown in FIG. 5b.

Figure 5C:
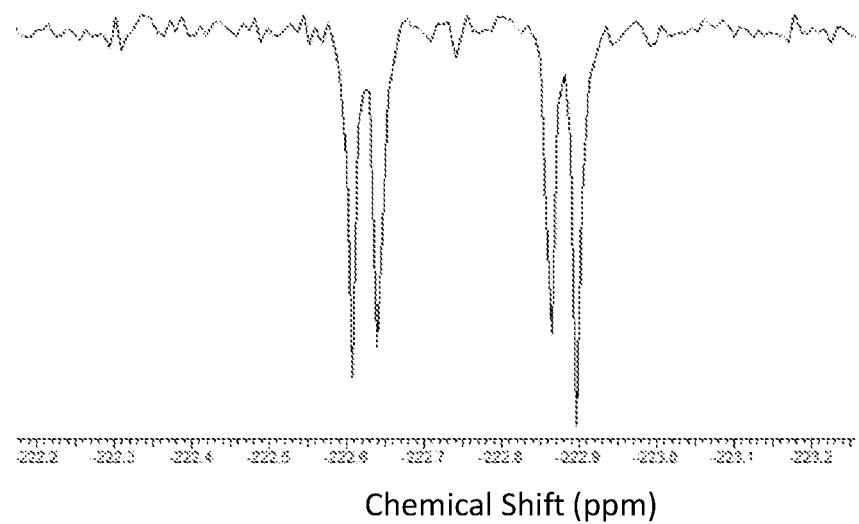
FIG. 5c shows a nuclear magnetic resonance spectrum determined based on a magnetization signal with prior exchange of the polarizations.

FIG. 5c shows a nuclear magnetic resonance spectrum determined based on a magnetization signal FID with prior exchange of the polarizations, i.e., in accordance with an embodiment of the proposed method. More specifically, the nuclear magnetic resonance spectrum shown in FIG. 5c is determined after carrying out only 4 iterations of the scan sequence SCAN using an inverse-recovery pulse sequence with a time delay $\tau_1$=1 s as an excitation pulse sequence EXC in each third step S3 of each scan sequence SCAN and by averaging over the magnetization signals FID measured in each third step S3 of the scan sequence SCAN. In each second step S2 of the scan sequence SCAN an indirect exchange of the polarizations by irradiating a first, second and third swap sequence SWAP in accordance with the embodiment discussed with respect to FIG. 5a is achieved. Thereby, the time delay/equilibration time between two scan sequences SCAN in the iteration loop is $T_{eq}$=10 s. The corresponding experiment lasted a total of about 1 minute. Finally, four results for the longitudinal relaxation times $T_1(N)$=(129±11)s, (101±3)s, (99±5)s, (107±8)s are determined in the fourth step S4 from the widths of the four Lorentzian shaped resonances of the nuclear magnetic resonance spectrum shown in FIG. 5c.

Clearly, the nuclear magnetic resonance spectra in FIGS. 5a and 5b and the determined nuclear magnetic relaxation times are similar and have been obtained with comparable signal to noise ratios. However, the nuclear magnetic resonance spectrum in FIG. 5c and the corresponding nuclear magnetic relaxation times have been determined in a more time-efficient and resource-efficient way.

Features of the different embodiments which are merely disclosed in the exemplary embodiments as a matter of course can be combined with one another and can also be claimed individually.

The invention claimed is:
1. A method of determining a nuclear magnetic resonance relaxation time of a probe and/or a nuclear magnetic resonance spectrum of a probe, wherein the probe comprises first nuclei with a first gyromagnetic ratio and second nuclei with a second gyromagnetic ratio, and the first gyromagnetic ratio is larger than the second gyromagnetic ratio, the method comprising:

a first step of polarizing the first nuclei and the second nuclei by applying a longitudinal static magnetic field $B_0$ to the probe;

a second step of exchanging the polarizations of the first nuclei and the second nuclei by irradiating at least one swap sequence of transverse magnetic field pulses;

a third step of transversely magnetizing the second nuclei by irradiating at least one excitation pulse and measuring the resulting magnetization signal;

a fourth step of determining the nuclear magnetic resonance relaxation time and/or the nuclear magnetic resonance spectrum based on the measured magnetization signal, wherein a temporal length of the at least one swap sequence is substantially identical to an inverse of the longitudinal spin-spin interaction strength between the first nuclei and the second nuclei.

2. The method according to claim 1, wherein by irradiating the at least one swap sequence of transverse magnetic field pulses in the second step the nuclear spins of the first nuclei and the nuclear spins of the second nuclei become realigned in the direction of the longitudinal static magnetic field $B_0$ immediately after the second step is carried out and before the third step is carried out.

3. The method according to claim 1, wherein the irradiating of the at least one swap sequence of transverse magnetic field pulses in the second step comprises irradiating a first sequence of transverse magnetic field pulses to excite the first nuclei and irradiating a second sequence of transverse magnetic field pulses to excite the second nuclei, wherein pulse frequencies of the transverse magnetic field pulses of the first sequence correspond to the Larmor frequency of the first nuclei in the longitudinal static magnetic field $B_0$, and pulse frequencies of the transverse magnetic field pulses of the second sequence correspond to the Larmor frequency of the second nuclei in the longitudinal static magnetic field $B_0$.

4. The method according to claim 3, wherein the transverse magnetic field pulses of the first sequence and the transverse magnetic field pulses of the second sequence are irradiated simultaneously and synchronously, and/or the temporal length of the first sequence of transverse magnetic field pulses is the same as the temporal length of the second sequence of transverse magnetic field pulses.

5. The method according to claim 3, wherein transverse magnetic field pulse of the first sequence corresponds to a transverse magnetic field pulse of the second sequence in terms of a pulse-center timing, a magnetic field pulse rotation angle and/or a magnetic field pulse oscillation direction.

6. A non-transitory computer readable medium comprising instructions which, when the program is executed by a computer, cause the computer to carry out the steps of the method according to claim 1.

7. A method of determining a nuclear magnetic resonance relaxation time of a probe and/or a nuclear magnetic resonance spectrum of a probe, wherein the probe comprises first nuclei with a first gyromagnetic ratio and second nuclei with a second gyromagnetic ratio, and the first gyromagnetic ratio is larger than the second gyromagnetic ratio, the method comprising:

a first step of polarizing the first nuclei and the second nuclei by applying a longitudinal static magnetic field $B_0$ to the probe;

a second step of exchanging the polarizations of the first nuclei and the second nuclei by irradiating at least one swap sequence of transverse magnetic field pulses;

a third step of transversely magnetizing the second nuclei by irradiating at least one excitation pulse and measuring the resulting magnetization signal; and a fourth step of determining the nuclear magnetic resonance relaxation time and/or the nuclear magnetic resonance spectrum based on the measured magnetization signal;

wherein the irradiating of the at least one swap sequence of transverse magnetic field pulses, the irradiating of the first sequence of transverse magnetic field pulses and/or the irradiating of the second sequence of transverse magnetic field pulses in the second step comprises:

irradiating a first transverse magnetic field pulse, wherein the first transverse magnetic field pulse is a $(\pi_x/2)$-pulse;

irradiating a second transverse magnetic field pulse with a predetermined time delay $t_D$ after irradiating the first transverse magnetic field pulse, wherein the second transverse magnetic field pulse is a $\pi_x$-pulse;

irradiating a third transverse magnetic field pulse with the predetermined time delay $t_D$ after irradiating the second transverse magnetic field pulse, wherein the third transverse magnetic field pulse is a $\pi_x$-pulse;

irradiating a fourth transverse magnetic field pulse with no time delay and immediately after irradiating the third transverse magnetic field pulse, wherein the fourth transverse magnetic field pulse is a $(\pi_{-x}/2)$-pulse;

irradiating a fifth transverse magnetic field pulse with no time delay and immediately after irradiating the fourth transverse magnetic field pulse, wherein the fifth transverse magnetic field pulse is a $(\pi_y/2)$-pulse;

irradiating a sixth transverse magnetic field pulse with the predetermined time delay $t_D$ after irradiating the fifth transverse magnetic field pulse, wherein the sixth transverse magnetic field pulse is a $\pi_x$-pulse; and irradiating a seventh transverse magnetic field pulse with the predetermined time delay $t_D$ after irradiating the sixth transverse magnetic field pulse, wherein the seventh transverse magnetic field pulse is a $(\pi_{-y}/2)$-pulse.

8. The method according to claim 7, wherein the predetermined time delay is $t_D=1/(4\ J_{HN})$, wherein $J_{HN}$ is the longitudinal spin-spin interaction strength between the first nuclei and the second nuclei.

9. The method according to claim 7, wherein at least the second step and the third step form a scan sequence that is repeatedly carried out before the fourth step is carried out in order to achieve an improved signal-to-noise ratio for the determination of the nuclear magnetic resonance relaxation time and/or the nuclear magnetic resonance spectrum in the fourth step, wherein the time delay between carrying out two scan sequences corresponds to a thermal equilibration time $T_{eq}$ of the first nuclei.

10. A method of determining a nuclear magnetic resonance relaxation time of a probe and/or a nuclear magnetic resonance spectrum of a probe, wherein the probe comprises first nuclei with a first gyromagnetic ratio and second nuclei with a second gyromagnetic ratio, and the first gyromagnetic ratio is larger than the second gyromagnetic ratio, the method comprising:

a first step of polarizing the first nuclei and the second nuclei by applying a longitudinal static magnetic field $B_0$ to the probe;

a second step of exchanging the polarizations of the first nuclei and the second nuclei by irradiating at least one swap sequence of transverse magnetic field pulses;

a third step of transversely magnetizing the second nuclei by irradiating at least one excitation pulse and measuring the resulting magnetization signal; and a fourth step of determining the nuclear magnetic resonance relaxation time and/or the nuclear magnetic resonance spectrum based on the measured magnetization signal;

wherein the probe also comprises third nuclei with a third gyromagnetic ratio, and the exchanging of the polarization of the first nuclei and the second nuclei by irradiating at least one swap sequence of transverse magnetic field pulses in the second step comprises:

exchanging of the polarization of the first nuclei and the third nuclei by irradiating a first swap sequence of transverse magnetic field pulses;

exchanging of the polarization of the third nuclei and the second nuclei by irradiating a second swap sequence of transverse magnetic field pulses; and exchanging of the polarization of the first nuclei and the third nuclei by irradiating a third swap sequence of transverse magnetic field pulses.

11. The method according to claim 10, wherein:

a longitudinal spin-spin interaction strength $J_{HN}$ between the first nuclei and the second nuclei is smaller than a longitudinal spin-spin interaction strength $J_{HC}$ between the first nuclei and the third nuclei; and/or a longitudinal spin-spin interaction strength $J_{HN}$ between the first nuclei and the second nuclei is smaller than a longitudinal spin-spin interaction strength $J_{CN}$ between the second nuclei and the third nuclei.

12. The method according to claim 10, wherein the first nuclei are atomic nuclei of $^1H$ isotopes and/or the second nuclei are atomic nuclei of $^{15}N$ isotopes or $^{13}C$ isotopes.

13. The method according to claim 10, wherein:

the nuclear magnetic resonance relaxation time is a longitudinal relaxation time of the second nuclei or a transverse relaxation time of the second nuclei; and/or the nuclear magnetic resonance spectrum is a one-dimensional nuclear magnetic resonance spectrum of the second nuclei; and/or multiple excitation pulses are irradiated in the third step, wherein the multiple excitation pulses correspond to a saturation-recovery pulse sequence, an inverse-recovery pulse sequence and/or a Carr-Purcell-Meiboom-Gil pulse sequence.

14. An apparatus configured to determine a nuclear magnetic resonance relaxation time of a probe and/or a nuclear magnetic resonance spectrum of a probe, wherein the probe comprises first nuclei with a first gyromagnetic ratio and second nuclei with a second gyromagnetic ratio, and the first gyromagnetic ratio is larger than the second gyromagnetic ratio, wherein the apparatus comprises:

at least one static magnetic field generating unit configured to polarize the first nuclei and the second nuclei by applying a longitudinal static magnetic field $B_0$ to the probe;

at least one electromagnetic pulse generating unit configured to exchange the polarizations of the first nuclei and the second nuclei by irradiating at least one swap sequence of transverse magnetic field pulses, and to transversely magnetize the second nuclei by irradiating at least one excitation pulse of transverse magnetic field pulses;

at least one signal receiving unit configured to measure a magnetization signal resulting from the at least one excitation pulse; and at least one electronic control and evaluation unit configured to determine the nuclear magnetic resonance relaxation time and/or the nuclear magnetic resonance spectrum based on the measured magnetization signal, wherein a temporal length of the at least one swap sequence is substantially identical to an inverse of the longitudinal spin-spin interaction strength between the first nuclei and the second nuclei.

* * * * *